(12) United States Patent
Hu

(10) Patent No.: US 11,877,468 B2
(45) Date of Patent: Jan. 16, 2024

(54) DISPLAY PANEL AND DISPLAY DEVICE

(71) Applicants: Chengdu BOE Optoelectronics Technology Co., Ltd., Sichuan (CN); BOE TECHNOLOGY GROUP CO., LTD., Beijing (CN)

(72) Inventor: Junlin Hu, Beijing (CN)

(73) Assignees: Chengdu BOE Optoelectronics Technology Co., Ltd., Sichuan (CN); BOE TECHNOLOGY GROUP CO., LTD., Beijing (CN)

( * ) Notice: Subject to any disclaimer, the term of this patent is extended or adjusted under 35 U.S.C. 154(b) by 259 days.

(21) Appl. No.: 16/764,553

(22) PCT Filed: May 27, 2019

(86) PCT No.: PCT/CN2019/088602
§ 371 (c)(1),
(2) Date: May 15, 2020

(87) PCT Pub. No.: WO2020/237469
PCT Pub. Date: Dec. 3, 2020

(65) Prior Publication Data
US 2021/0408431 A1    Dec. 30, 2021

(51) Int. Cl.
*H10K 50/84* (2023.01)
*G06F 3/041* (2006.01)
(Continued)

(52) U.S. Cl.
CPC ........... *H10K 50/841* (2023.02); *G06F 3/041* (2013.01); *H10K 59/35* (2023.02); *H10K 59/40* (2023.02); *H10K 2102/351* (2023.02)

(58) Field of Classification Search
CPC . H01L 27/323; H01L 51/524; H01L 27/3211; H01L 2251/558; G06F 3/041;
(Continued)

(56) References Cited

U.S. PATENT DOCUMENTS 10,067,535 B2     9/2018   Prest et al.
2016/0316582 A1 * 10/2016  Seo ........................... G02F 1/13
(Continued)

FOREIGN PATENT DOCUMENTS

CN          101989141 A       3/2011
CN          204087706 U       1/2015
(Continued)

OTHER PUBLICATIONS

International Search Report of PCT/CN2019/088602 in Chinese, dated Feb. 24, 2020 with English Translation.
(Continued)

*Primary Examiner* — Latanya N Crawford Eason
(74) *Attorney, Agent, or Firm* — Collard & Roe, P.C.; William Collard

(57) ABSTRACT

A display panel and a display device. The display panel includes a display panel main body and a cover plate; the display panel main body has a light emitting surface, and the cover plate covers the light emitting surface of the display panel main body; the light emitting surface includes a flat light emitting region and a curved light emitting region, the cover plate includes a curved portion covering the curved light emitting region; in a direction from the flat light emitting region to the curved light emitting region, thicknesses of positions of the curved portion gradually decrease.

16 Claims, 2 Drawing Sheets

(51) Int. Cl.
  *H10K 59/35* (2023.01)
  *H10K 59/40* (2023.01)
  *H10K 102/00* (2023.01)

(58) Field of Classification Search
  CPC ...... H10K 50/841; H10K 59/40; H10K 59/35; H10K 2102/351; H10K 50/842; H10K 59/871; H10K 59/872
  See application file for complete search history.

(56) References Cited

U.S. PATENT DOCUMENTS

| | | | | |
|---|---|---|---|---|
| 2016/0365393 | A1* | 12/2016 | Kim | H01L 51/0097 |
| 2017/0092703 | A1* | 3/2017 | Bae | H01L 27/3232 |
| 2017/0336664 | A1* | 11/2017 | Zhu | G06F 3/0412 |
| 2019/0371869 | A1* | 12/2019 | Yan | H01L 51/0097 |
| 2020/0209916 | A1* | 7/2020 | Zhang | H01L 51/56 |

FOREIGN PATENT DOCUMENTS

| | | | | |
|---|---|---|---|---|
| CN | 104332107 | A | 2/2015 | |
| CN | 105182590 | A | 12/2015 | |
| CN | 205003411 | U | 1/2016 | |
| CN | 106647007 | A | 5/2017 | |
| CN | 108550610 | A * | 9/2018 | ............. G06F 21/32 |
| CN | 108598130 | A * | 9/2018 | ......... H01L 27/3232 |
| CN | 108598130 | A | 9/2018 | |
| CN | 108711577 | A | 10/2018 | |

OTHER PUBLICATIONS

Notice of Transmittal of the International Search Report of PCT/CN2019/088602 in Chinese, dated Feb. 24, 2020.
Written Opinion of the International Searching Authority of PCT/CN2019/088602 in Chinese, dated Feb. 24, 2020.
International Search Report of PCT/CN2019/088602 in Chinese, dated Feb. 24, 2020.

* cited by examiner

DISPLAY PANEL AND DISPLAY DEVICE

CROSS REFERENCE TO RELATED APPLICATIONS

This application is the National Stage of PCT/CN2019/088602 filed on May 27, 2019, the disclosure of which is incorporated by reference.

TECHNICAL FIELD

Embodiments of the present disclosure relate to a display panel and a display device.

BACKGROUND

With the continuous development of science and technology, display panels are widely used in various electronic devices, such as smart phones, tablet computers, notebook computers, car navigation, etc. Common display panels can be divided into liquid crystal display (LCD) panels and organic light emitting diode (OLED) display panels.

Generally, a light shielding layer is arranged on the periphery of the display panel to shield the leads on the periphery of the display panel. However, the existence of the light shielding layer will cause the display panel to have a wide frame and make the proportion of the display region for display of the display panel is small.

SUMMARY

Embodiments of the present disclosure provide a display panel and a display device. The display panel includes a display panel main body and a cover plate; the display panel main body has a light emitting surface, the cover plate covers the light emitting surface of the display panel main body; the light emitting surface includes a flat light emitting region and a curved light emitting region, the cover plate includes a curved portion covering the curved light emitting region; in a direction from the flat light emitting region to the curved light emitting region, thicknesses of positions of the curved portion gradually decrease. Therefore, the curved portion can deflect the light emitted from the curved light emitting region to the normal direction of the flat light emitting region, thereby reducing the viewing angle when the user observes the display panel from the front, and further avoiding the color shift phenomenon caused by too large viewing angle.

At least one embodiment of the present disclosure provides a display panel, including: a display panel main body, having a light emitting surface; and a cover plate, covering the light emitting surface of the display panel main body. The light emitting surface includes a flat light emitting region and a curved light emitting region, the cover plate includes a curved portion covering the curved light emitting region, in a direction from the flat light emitting region to the curved light emitting region, thicknesses of positions of the curved portion gradually decrease.

For example, in the display panel provided by one embodiment of the present disclosure, the curved portion is bent toward a side where the display panel main body is located, and the curved portion includes: a first surface at a side of the curved portion away from the curved light emitting region; and a second surface at a side of the curved portion close to the curved light emitting region.

For example, in the display panel provided by one embodiment of the present disclosure, the first surface includes a first position, the second surface includes a second position, a normal line of the second position passes through the first position, an included angle between a normal line of the first position and the normal line of the second position is $\alpha$, and $\alpha=\arcsin[(n0/n1)*\sin\beta]$, n0 is the refractive index of air, n1 is the refractive index of the cover plate, and a value range of R is 30-50 degrees.

For example, in the display panel provided by one embodiment of the present disclosure, the value range of R is 40-41 degrees.

For example, in the display panel provided by one embodiment of the present disclosure, the first surface has a same radius of curvature on each position, the second surface has a same radius of curvature on each position, and the radius of curvature of the first surface is greater than the radius of curvature of the second surface.

For example, in the display panel provided by one embodiment of the present disclosure, the display panel main body includes an organic light emitting element.

For example, in the display panel provided by one embodiment of the present disclosure, the organic light emitting element includes: a first light emitting element configured to emit a first color light; and a second light emitting element configured to emit a second color light, a decay degree of brightness of the first light emitting element with a viewing angle is greater than a decay degree of brightness of the second light emitting element with a viewing angle.

For example, in the display panel provided by one embodiment of the present disclosure, the organic light emitting element further includes: a third light emitting element, configured to emit a third color light, the first color is red, the second color is green, and the third color is blue.

For example, in the display panel provided by one embodiment of the present disclosure, the cover plate further includes a flat portion covering the flat light emitting region, and the flat portion has a same thickness on each position.

For example, in the display panel provided by one embodiment of the present disclosure, the cover plate is a transparent cover plate.

For example, in the display panel provided by one embodiment of the present disclosure, the material of the cover plate includes glass.

For example, in the display panel provided by one embodiment of the present disclosure, a thickness of a connection position of the curved portion and the flat portion is the same as a thickness of the flat portion.

For example, in the display panel provided by one embodiment of the present disclosure, a surface of the cover plate away from the display panel main body is a continuous surface.

For example, the display panel provided by one embodiment of the present disclosure further includes: a touch structure, positioned at least between the curved light emitting region and the curved portion to realize a touch function at a lateral edge of the display panel.

For example, in the display panel provided by one embodiment of the present disclosure, the curved light emitting region is at the periphery of the flat light emitting region.

For example, in the display panel provided by one embodiment of the present disclosure, the curved light emitting region is on two sides of the flat light emitting region.

At least one embodiment of the present disclosure further provides a display device, including the above-mentioned display panel.

BRIEF DESCRIPTION OF THE DRAWINGS

In order to clearly illustrate the technical solution of the embodiments of the present disclosure, the drawings of the embodiments will be briefly described in the following; it is obvious that the described drawings are only related to some embodiments of the present disclosure and thus are not limitative of the present disclosure.

DETAILED DESCRIPTION

In order to make objects, technical details and advantages of the embodiments of the present disclosure apparent, the technical solutions of the embodiment will be described in a clearly and fully understandable way in connection with the drawings related to the embodiments of the present disclosure. It is obvious that the described embodiments are just a part but not all of the embodiments of the present disclosure. Based on the described embodiments herein, those skilled in the art can obtain other embodiment(s), without any inventive work, which should be within the scope of the present disclosure.

Unless otherwise defined, all the technical and scientific terms used herein have the same meanings as commonly understood by one of ordinary skill in the art to which the present disclosure belongs. The terms "first," "second," etc., which are used in the description and the claims of the present application for disclosure, are not intended to indicate any sequence, amount or importance, but distinguish various components. The terms "comprise," "comprising," "include," "including," etc., are intended to specify that the elements or the objects stated before these terms encompass the elements or the objects and equivalents thereof listed after these terms, but do not preclude the other elements or objects. The phrases "connect", "connected", etc., are not intended to define a physical connection or mechanical connection, but may include an electrical connection, directly or indirectly.

At present, because people's requirements for the appearance and performance of electronic devices such as smart phones continue to improve, display panels with a wide frame can no longer meet the requirements of the market. Therefore, how to reduce the frame to achieve "narrow frame" or even "no frame" has become a research focus of major display panel manufacturers.

Figure 1:
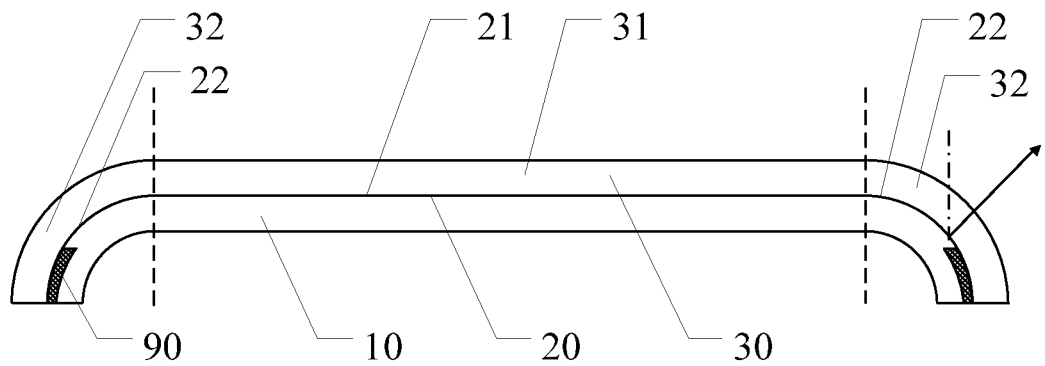
FIG. 1 is a schematic structural diagram of a display panel with curved edges.

In the research, the inventor of the present application noticed that by designing the edge of the display panel as a curved surface, the frame of the display panel can be narrowed, and even no frame can be realized, but this method can lead to color shift phenomenon on the edge of the display panel, such as greenish phenomenon, thereby leading to a reduction in yield, affecting the display quality and affecting the user experience. FIG. 1 illustrates a display panel with curved edges. As illustrated in FIG. 1, the display panel includes a display panel main body 10 and a cover plate 30; the display panel main body 10 has a light emitting surface 20 including a flat light emitting region 21 and a curved light emitting region 22; the cover plate 30 includes a flat portion 31 and a curved portion 32, the flat portion 31 covers the flat light emitting region 21, and the curved portion 32 covers the curved light emitting region 22. Upon the user viewing the display panel from the front, because the light shielding layer is arranged at the edge of the display panel, i.e., the position corresponding to the curved portion 32 of the cover plate 30, the user can only see the oblique projection of the light shielding layer 90 through the curved portion, thereby the shielding range of the light shielding layer is reduced. However, because the curved portion 32 of the cover plate 30 has an arc, upon the user viewing the display panel from the front, the user's sight line has a large view angle (such as an view angle of about 40 degrees) with the light emitted from the curved portion. Upon the light brightness decay of the red, green and blue sub pixels of the display panel with the viewing angles being inconsistent, a large viewing angle will cause color shift at the curved edge of the display panel. Because the light brightness decay of the red sub pixel with the viewing angle is greater than that of the green sub pixel with the viewing angle in general, the color shift phenomenon of the curved edge of the display panel usually appears as a greenish phenomenon.

For the above, the embodiments of the present disclosure provide a display panel and a display device. The display panel includes a display panel main body and a cover plate; the display panel main body is provided with a light emitting surface, and the cover plate covers the light emitting surface of the display panel main body; the light emitting surface includes a flat light emitting region and a curved light emitting region, and the cover plate includes a curved portion covering the curved light emitting region; in the direction from the flat light emitting region to the curved light emitting region, thicknesses of positions of the curved portion gradually decrease. Therefore, the curved portion can deflect the light emitted from the curved light emitting region to the normal direction of the flat light emitting region, thereby reducing the viewing angle when the user observes the display panel from the front, and further avoiding the color shift phenomenon caused by too large viewing angle.

Hereinafter, the display panel and the display device provided by the embodiments of the present disclosure will be described in detail with reference to the accompanying drawings.

Figure 2:
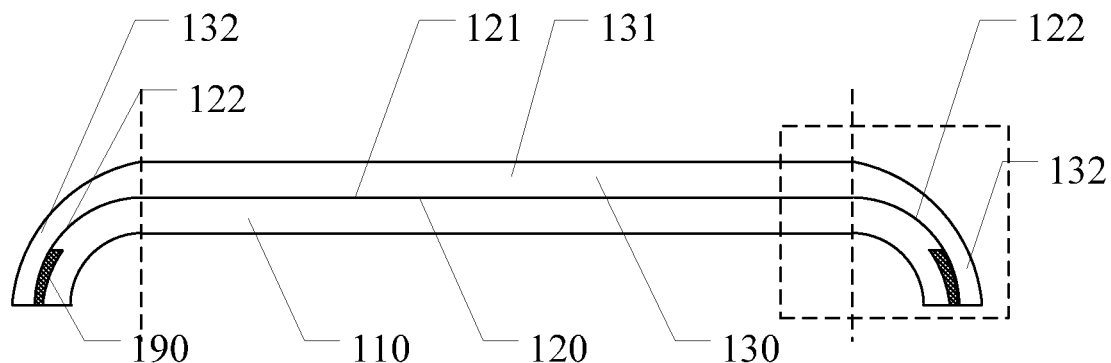
FIG. 2 is a schematic structural diagram of a display panel according to an embodiment of the present disclosure.
Figure 3:
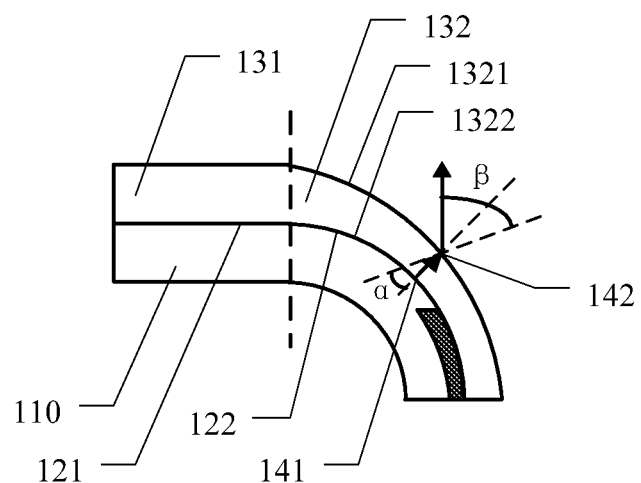
FIG. 3 is a partially enlarged schematic view of the display panel illustrated in FIG. 2.

An embodiment of the present disclosure provides a display panel. FIG. 2 is a schematic structural diagram of a display panel according to an embodiment of the present disclosure. FIG. 3 is a partially enlarged schematic view of the display panel illustrated by the dashed line box in FIG. 2. As illustrated in FIGS. 2 and 3, the display panel 100 includes a display panel main body 110 and a cover plate 130; the display panel main body 110 has a light emitting surface 120, and the cover plate 130 covers the light emitting surface 120 of the display panel main body 110. The light emitting surface 120 includes a flat light emitting region 121 and a curved light emitting region 122, and the cover plate 130 includes a curved portion 132 covering the curved light emitting region 122; in the direction from the flat light emitting region 121 to the curved light emitting region 122, the thicknesses of positions of the curved portion 132 gradually decrease. It should be noted that, in order to clearly illustrate the above-mentioned flat light emitting region and curved light emitting region, the dividing line (dashed line) between the flat light emitting region and curved light emitting region is drawn in FIGS. 2 and 3, however, the above-mentioned dividing line does not mean that the flat light emitting region and curved light emitting region are different in material.

In the display panel provided by this embodiment of the present disclosure, in the direction from the flat light emitting region to the curved light emitting region, the thicknesses of positions of the curved portion gradually decrease, and according to the refraction principle of light, the curved portion can deflect the light emitted from the curved light emitting region toward the normal direction of the flat light emitting region, thereby reducing the viewing angle when a user views the display panel from the front, and further avoiding the phenomenon of color shift of the curved edge of the display panel caused by the large viewing angle when the light brightness decay of red, green and blue sub pixels with the viewing angle is inconsistent.

For example, in some examples, the cover plate 130 can be a transparent cover plate so as to transmit light emitted from the display panel main body 110.

For example, in some examples, the material of the cover plate 130 includes glass, that is, the cover plate 130 is a glass cover plate, so that on the one hand, the light emitted by the display panel main body 110 can be better transmitted, and on the other hand, the display panel main body 110 can be well protected. Of course, embodiments of the present disclosure include but are not limited to this, and the cover plate 130 can be made of other suitable materials.

For example, in some examples, as illustrated in FIGS. 2 and 3, the cover plate 130 further includes a flat portion 131 covering the flat light emitting region 121, and the flat portion 131 has a same thickness on each position. It should be noted that the surface of the cover plate 130 away from the display panel main body 110 is a continuous surface, that is, the surface of the flat portion 131 away from the display panel main body 110 and the surface of the curved portion 132 away from the display panel main body 110 are connected and continuous. For example, the thickness of the connection position of the curved portion 132 and the flat portion 131 is the same as the thickness of the flat portion 131. At this time, in the direction from the flat light emitting region 121 to the curved light emitting region 122, because the thicknesses of positions of the curved portion 132 gradually decrease, the curved portion 132 can deflect the light emitted from the curved light emitting region 122 toward the normal direction of the flat light emitting region 121, thereby reducing the viewing angle of the user when viewing the display panel from the front, and further avoiding the color shift phenomenon caused by too large viewing angle. It should be noted that, in order to clearly illustrate the above-mentioned flat portion and curved portion, the dividing line (dashed line) between the flat portion and the curved portion is drawn in FIGS. 2 and 3, however, the above-mentioned dividing line does not mean that the flat portion and curved portion are different in material. The above-mentioned "user viewing from the front" means that the user's sight line is perpendicular to the flat portion or the flat light emitting region.

For example, in some examples, as illustrated in FIGS. 2 and 3, the curved portion 132 is bent in a direction away from the light emitting surface 120, that is, the curved portion 132 is bent toward the side where the display panel main body 110 is located. The curved portion 132 includes a first surface 1321 and a second surface 1322; the first surface 1321 is located on the side of the curved portion 132 away from the curved light emitting region 122, and the second surface 1322 is located on the side of the curved portion 132 close to the curved light emitting region 122. For example, the second surface 1322 can be arranged cling to the display panel main body 110.

For example, in some examples, as illustrated in FIG. 3, the first surface 1321 includes a first position 141, the second surface 1322 includes a second position 142, the normal line of the second position 142 passes through the first position 141, the included angle α between the normal line of the first position 141 and the normal line of the second position 142=arcsin [(n0/n1)*sin β], n0 is the refractive index of air, n1 is the refractive index of the cover plate, and the value range of β is 30-50 degrees. When the light emitted from the curved light emitting region is emitted at a second position perpendicular to the second surface, according to Snell's refraction law, the propagation direction of the light does not change, and the light emitted from the curved light emitting region propagates along the normal direction of the second position; when the light emitted from the curved light emitting region passes through the first position of the first surface, because the refractive index (n1) of the cover plate is greater than the refractive index (n0) of air, the light emitted from the curved light emitting region is deflected by β toward the normal direction of the flat light emitting region, and β is greater than α. The above-mentioned β is the angle by which the curved portion can deflect the light emitted from the curved light emitting region toward the normal direction of the flat light emitting region. When the value range of β is 30-50 degrees, the phenomenon of color shift at the curved edge of the display panel due to the large viewing angle can be effectively avoided when the light brightness decay of the red, green and blue sub pixels with the viewing angle is inconsistent. In addition, according to the included angle α between the normal line of the first position and the normal line of the second position and the curvature of each position of the second surface, the curvature of each position of the first surface can be calculated, so that each position on the curved portion can deflect the light emitted from the curved light emitting region to the normal direction of the flat light emitting region by the above-mentioned β angle.

For example, in some examples, when the viewing angle when the user views the display panel from the front is in the range of 40-41 degrees, the value range of β is in the range of 40-41 degrees, thus further effectively avoiding the phenomenon of color shift at the curved edge of the display panel due to the large viewing angle when the light brightness decay of red, green and blue sub pixels with the viewing angle is inconsistent.

For example, in some examples, the first surface 1321 has a same radius of curvature on each position, the second surface 1322 has a same radius of curvature on each position, thus facilitating fabrication. In addition, upon the first surface 1321 having a same radius of curvature on each position, the second surface 1322 having a same radius of curvature on each position, the radius of curvature of the first surface 1321 is greater than the radius of curvature of the second surface 1322. Of course, embodiments of the present disclosure include but are not limited to this. The radius of curvature of each position on the first surface can also be different, and the radius of curvature of each position on the second surface can also be different. The radius of curvature of each position on the second surface can be determined according to the radius of curvature of each position on the curved light emitting region of the display panel main body, and the radius of curvature of each position on the first surface can be determined according to the radius of curvature of each position on the second surface. For example, in some examples, the curved portion can deflect light emitted from the curved light emitting region approximately 41 degrees toward the normal direction of the flat light emitting region, so that the viewing angle when the user views the display panel from the front is close to zero, thereby completely avoiding the phenomenon of color shift at the curved edge of the display panel caused by the large viewing angle when the light brightness decay of red, green and blue sub pixels with the viewing angle is inconsistent.

For example, in some examples, as illustrated in FIGS. 2 and 3, the curved light emitting region 122 is located at the periphery of the flat light emitting region 121, thereby serving to narrow or even eliminate the frame of the display panel.

For example, in some examples, the curved light emitting region 122 is located on the two sides of the flat light emitting region 121, so that it can also be conveniently held by a human hand.

For example, in some examples, the display panel main body can include an organic light emitting display element 112, i.e., the display panel can be an organic light emitting display panel. Because the light brightness decay of red, green and blue sub pixels with viewing angles in a common organic light emitting display panel is obviously inconsistent, the display panel provided by this embodiment of the present disclosure can better improve the color shift phenomenon at the edge of the organic light emitting display panel. Of course, embodiments of the present disclosure include but are not limited to this, and the display panel main body can also adopt other suitable display structures.

Figure 4:
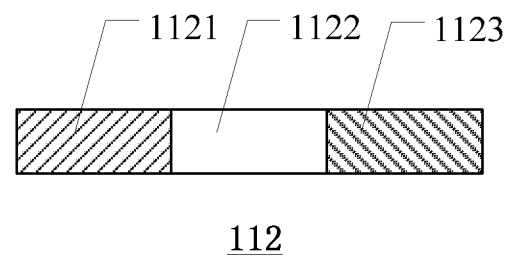
FIG. 4 is a schematic diagram of an organic light emitting element according to an embodiment of the present disclosure.

FIG. 4 is a schematic diagram of an organic light emitting element according to an embodiment of the present disclosure. As illustrated in FIG. 4, the organic light emitting element 112 includes a first light emitting element 1121 and a second light emitting element 1122; the first light emitting element 1121 is configured to emit a first color light, and the second light emitting element 1122 is configured to emit a second color light; the decay degree of brightness of the first light emitting element 1121 with the viewing angles is greater than the decay degree of brightness of the second light emitting element 1122 with the viewing angles. When the viewing angle is large, the light brightness decay of the first light emitting element 1121 is large, and the light brightness decay of the second light emitting element 1122 is small, thus causing a greenish phenomenon. As a result, the curved portion can reduce the viewing angle when the user views the display panel from the front by deflecting the light emitted from the curved light emitting region toward the normal direction of the flat light emitting region, thereby avoiding inconsistent light brightness decay of the first light emitting element 1121 and the second light emitting element 1122, and further avoiding color shift phenomenon at the curved edge of the display panel due to a large viewing angle when the light brightness decay of the first light emitting element 1121 and the second light emitting element 1122 with the viewing angles is inconsistent.

For example, in some examples, the first light emitting element 1121 is configured to emit red light and the second light emitting element 1122 is configured to emit green light. As a result, the curved portion can deflect the light emitted from the curved light emitting region toward the normal direction of the flat light emitting region, thereby reducing the viewing angle when the user views the display panel from the front, preventing the light brightness decay of red light from being greater than that of filtered light, and further avoiding the greenish phenomenon at the curved edge of the display panel caused by the large viewing angle when the light brightness decay of the first light emitting element 1121 and the second light emitting element 1122 with the viewing angles is inconsistent. For example, in some examples, as illustrated in FIG. 4, the organic light emitting element 112 further includes a third light emitting element 1123, the third light emitting element 1123 is configured to emit blue light. Thus, the display panel is a display panel adopting RGB arrangement. Of course, embodiments of the present disclosure include but are not limited to this.

Figure 5:
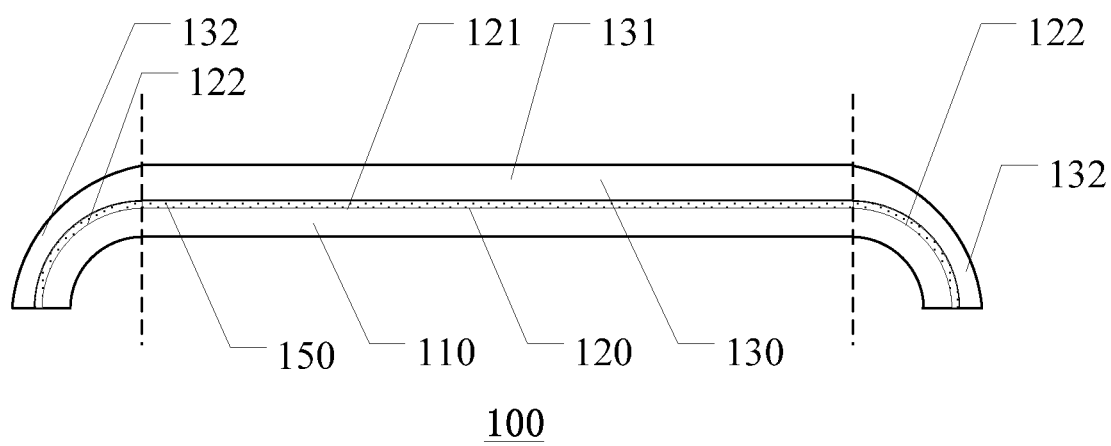
FIG. 5 is a schematic structural diagram of another display panel according to an embodiment of the present disclosure.

FIG. 5 is a schematic structural diagram of another display panel according to an embodiment of the present disclosure. As illustrated in FIG. 5, the display panel can further include a touch structure 150, positioned at least between the curved light emitting region 122 and the curved portion 132 to realize a touch function at the lateral edge of the display panel. Of course, the touch structure 150 can be arranged on the whole surface of the flat light emitting region 121 and the curved light emitting region 122 to realize full touch.

Figure 6:
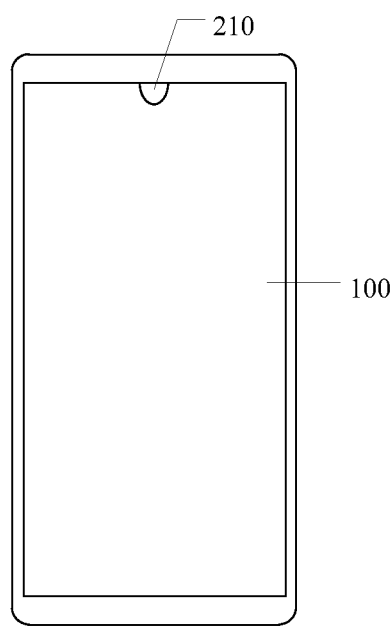
FIG. 6 is a schematic diagram of a display device according to an embodiment of the present disclosure.

An embodiment of the present disclosure further provides a display device. FIG. 6 is a schematic diagram of a display device according to an embodiment of the present disclosure. As illustrated in FIG. 6, the display device 200 includes the above-mentioned display panel 100, so that the viewing angle when the user views the display panel from the front can be reduced, and the color shift phenomenon at the curved edge of the display panel due to the large viewing angle when the light brightness decay of red, green and blue sub pixels with the viewing angles is inconsistent can be avoided.

For example, in some examples, the display device can be a smart phone. At this time, the display device can also include functional components such as a camera. Of course, embodiments of the present disclosure include but are not limited to this. The display device can also be notebook computers, televisions, tablet computers, car navigation devices, electronic photo albums and other electronic products with display functions.

The following statements should be noted:
(1) The accompanying drawings involve only the structure(s) in connection with the embodiment(s) of the present disclosure, and other structure(s) can be referred to common design(s).
(2) In case of no conflict, features in one embodiment or in different embodiments can be combined.

What have been described above are only specific implementations of the present disclosure, the protection scope of the present disclosure is not limited thereto. Any changes or substitutions easily occur to those skilled in the art within the technical scope of the present disclosure should be covered in the protection scope of the present disclosure. Therefore, the protection scope of the present disclosure should be based on the protection scope of the claims.

The invention claimed is:

1. A display panel, comprising: a display panel main body, having a light emitting surface; and a cover plate, covering the light emitting surface of the display panel main body, wherein the light emitting surface comprises a flat light emitting region and a curved light emitting region, the cover plate comprises a curved portion covering the curved light emitting region, thicknesses of positions of the curved portion gradually decrease in a direction from the flat light emitting region to the curved light emitting region, wherein the display panel further comprises a light shielding layer, located at an edge of the display panel, the curved portion covers the light shielding layer, the curved portion is bent toward a side where the display panel main body is located, and the curved portion comprises a first curved surface and a second curved surface, the first curved surface is at a side of the curved portion away from the curved light emitting region, and the second curved surface at a side of the curved portion close to the curved light emitting region, in a direction from the flat light emitting region to the curved light emitting region, distances between the first curved surface and the second curved surface gradually decrease, the first curved surface comprises a first position, the second curved surface comprises a second position, a normal line of the second position passes through the first position, an included angle between a normal line of the first position and the normal line of the second position is $\alpha$, and $\alpha=\arcsin[(n0/n1)*\sin \beta]$, n0 is a refractive index of air, n1 is a refractive index of the cover plate, and a value range of $\beta$ is 30-50 degrees, the second curved surface of the curved portion is in contact with the light shielding layer and is a continuous cambered surface, a position of the light shielding layer is lower than a back surface of said flat light emitting region of the display panel main body away from the light emitting surface.

2. The display panel according to claim 1, wherein the value range of $\beta$ is 40-41 degrees.

3. The display panel according to claim 1, wherein the first curved surface has a same radius of curvature on each position, the second curved surface has a same radius of curvature on each position, and the radius of curvature of the first curved surface is greater than the radius of curvature of the second curved surface.

4. The display panel according to claim 1, wherein the display panel main body comprises an organic light emitting element, and the organic light emitting element comprises:
   a first light emitting element configured to emit a first color light; and
   a second light emitting element configured to emit a second color light,
   wherein a decay degree of brightness of the first light emitting element with a viewing angle is greater than a decay degree of brightness of the second light emitting element with a viewing angle.

5. The display panel according to claim 1, wherein the cover plate further comprises a flat portion covering the flat light emitting region, and the flat portion has a same thickness on each position.

6. The display panel according to claim 5, wherein a thickness of a connection position of the curved portion and the flat portion is the same as a thickness of the flat portion.

7. The display panel according to claim 1, wherein a surface of the cover plate away from the display panel main body is a continuous surface.

8. The display panel according to claim 1, further comprising: a touch structure, positioned at least between the curved light emitting region and the curved portion to realize a touch function at a lateral edge of the display panel.

9. The display panel according to claim 1, wherein the curved light emitting region is at the periphery of the flat light emitting region.

10. The display panel according to claim 9, wherein the curved light emitting region is on two sides of the flat light emitting region.

11. A display device, comprising the display panel according to claim 1.

12. The display panel according to claim 1, wherein the first curved surface has a same radius of curvature on each position, the second curved surface has a same radius of curvature on each position, and the radius of curvature of the first curved surface is greater than the radius of curvature of the second curved surface.

13. The display panel according to claim 2, wherein the first curved surface has a same radius of curvature on each position, the second curved surface has a same radius of curvature on each position, and the radius of curvature of the first curved surface is greater than the radius of curvature of the second curved surface.

14. The display panel according to claim 1, wherein the display panel main body comprises an organic light emitting element, and the organic light emitting element comprises:
   a first light emitting element configured to emit a first color light; and
   a second light emitting element configured to emit a second color light,
   wherein a decay degree of brightness of the first light emitting element with a viewing angle is greater than a decay degree of brightness of the second light emitting element with a viewing angle.

15. The display panel according to claim 2, wherein the display panel main body comprises an organic light emitting element, and the organic light emitting element comprises:
   a first light emitting element configured to emit a first color light; and
   a second light emitting element configured to emit a second color light,
   wherein a decay degree of brightness of the first light emitting element with a viewing angle is greater than a decay degree of brightness of the second light emitting element with a viewing angle.

16. The display panel according to claim 1, further comprising: a touch structure, positioned at least between the curved light emitting region and the curved portion to realize a touch function at a lateral edge of the display panel.

* * * * *